(12) United States Patent
Audette et al.

(10) Patent No.: US 7,688,089 B2
(45) Date of Patent: Mar. 30, 2010

(54) COMPLIANT MEMBRANE THIN FILM INTERPOSER PROBE FOR INTERGRATED CIRCUIT DEVICE TESTING

(75) Inventors: David M. Audette, Colchester, VT (US); John F. Hagios, Charlotte, VT (US); Christopher L Sullivan, Colchester, VT (US)

(73) Assignee: International Business Machines Corporation, Armonk, NY (US)

(*) Notice: Subject to any disclaimer, the term of this patent is extended or adjusted under 35 U.S.C. 154(b) by 127 days.

(21) Appl. No.: 12/019,807

(22) Filed: Jan. 25, 2008

(65) Prior Publication Data

US 2009/0189620 A1 Jul. 30, 2009

(51) Int. Cl.
*G01R 31/02* (2006.01)
(52) U.S. Cl. ..................... 324/754; 324/762
(58) Field of Classification Search ............... None
See application file for complete search history.

(56) References Cited

U.S. PATENT DOCUMENTS 3,806,801 A 4/1974 Bove
5,207,585 A 5/1993 Byrnes et al.
5,621,333 A 4/1997 Long et al.
6,023,103 A 2/2000 Chang et al.
6,426,636 B1 * 7/2002 Das et al. ..................... 324/754
6,528,984 B2 3/2003 Beaman et al.
6,566,150 B2 * 5/2003 Kohno et al. .................. 438/14
6,771,084 B2 8/2004 Di Stefano
7,109,731 B2 9/2006 Gleason et al.
7,126,358 B2 10/2006 Mok et al.
2004/0080329 A1 4/2004 Jain
2004/0246010 A1 12/2004 Di Stefano
2005/0140366 A1 6/2005 Bar et al.
2005/0212539 A1 9/2005 Chen et al.
2006/0006889 A1 * 1/2006 Smith et al. .................. 324/754

* cited by examiner

*Primary Examiner*—Vinh P Nguyen
(74) *Attorney, Agent, or Firm*—Cantor Colburn LLP; Michael LeStrange

(57) ABSTRACT

A probe test head for a high density pin count integrated circuit, includes: a flexible membrane; an array of conductive structures, each one of the structures including a mechanically compliant probe tip affixed to the membrane, such that an attachment point enables mechanical actuation of the probe tip through a conductive member parallel to the membrane. A method for fabrication and measurement apparatus are provided.

9 Claims, 8 Drawing Sheets

1ST CONTACT

FULL CONTACT

COMPLIANT MEMBRANE THIN FILM INTERPOSER PROBE FOR INTERGRATED CIRCUIT DEVICE TESTING

BACKGROUND OF THE INVENTION

1. Field of the Invention

The invention herein relates to microprobes for testing of integrated circuits, and more particularly, to a compliant membrane probe.

2. Description of the Related Art

Current thin film interposer (TFI) technology has provided significant performance improvements over existing vertical probe technologies. Reference may be had to existing thin film interposer technology from International Business Machines, Inc. of Armonk, N.Y. However, TFI is mechanically limited due to involvement of a rigid probe. For example, rigid probes may not conform well to non-planar samples that arise in a test environment. Examples include non-planar situations arising in "controlled collapsible chip connections" (C4). Commonly used controlled collapsible chip connections often include solder balls having a solder of about 97% lead and 3% tin. Diameters of the balls typically range from about 75 to about 125 micrometers, and provide for a chip-to-carrier interconnect.

The C4 process includes arranging an array of these balls or bumps on the surface of a chip, either in an area array or peripheral configuration. The chip is placed face down on a carrier. When heat is applied, the solder reflows to the pads joining the chip to the carrier. A non-planar C4 array profile can result from uneven thermal response during the reflow process, as well as temperature gradients within the chip during test.

Various testing apparatus include design features to compensate for an uneven profile. For example, rigid probes compensate for the initial non-planar relationship of controlled collapsible chip connections by mechanically deforming all of the connections until contact is made with each one. This requires a significant amount of force and is reaching the limits of current test hardware (Prober, probe cards, product wafer). Further, such mechanical stresses cause deformation of the solder balls sufficient to impact the integrity of C4 connectivity between the die and the chip carrier.

What are needed are techniques for making reliable test connections with a plurality of controlled collapsible chip connections. Preferably, the techniques minimize the deformation of the chip connections and do not require an application of excessive force. What are needed are techniques such as those disclosed herein.

BRIEF SUMMARY OF THE INVENTION

Disclosed is a probe test head for a high density pin count integrated circuit, including: a flexible membrane; an array of conductive structures, each one of the structures including a probe tip affixed to the flexible membrane, such that an attachment point enables mechanical actuation of the probe tip through a conductive member parallel to the membrane.

Also disclosed is a method for fabricating a compliant membrane probe for communication with an integrated circuit, the method including: selecting a flexible membrane; installing an array of conductive structures into the flexible membrane, each one of the structures including a probe tip affixed to the flexible membrane, such that an attachment point enables mechanical actuation of the probe tip through a conductive member parallel to the membrane.

Further provided is an apparatus for communicating with an integrated circuit, the apparatus including: a compliant membrane probe including a flexible membrane and an array of conductive structures, each one of the structures including a probe tip affixed to the flexible membrane, such that an attachment point enables mechanical actuation of the probe tip through a conductive member parallel to the membrane a device for communication with the compliant membrane probe; and an interface for providing signals from the compliant membrane probe.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Disclosed are aspects of a microprobe useful for testing of integrated circuits. The microprobe is generally referred to as a "compliant membrane probe," a "membrane probe," or as a "test head." Among other things, the compliant membrane probe provides for electrical performance enhancements during testing. Another advantage is provision of reliable contact with test samples while applying significantly less force than required by prior art designs. Manufacturing of the probe generally makes use of conventional manufacturing techniques.

Figure 1A:
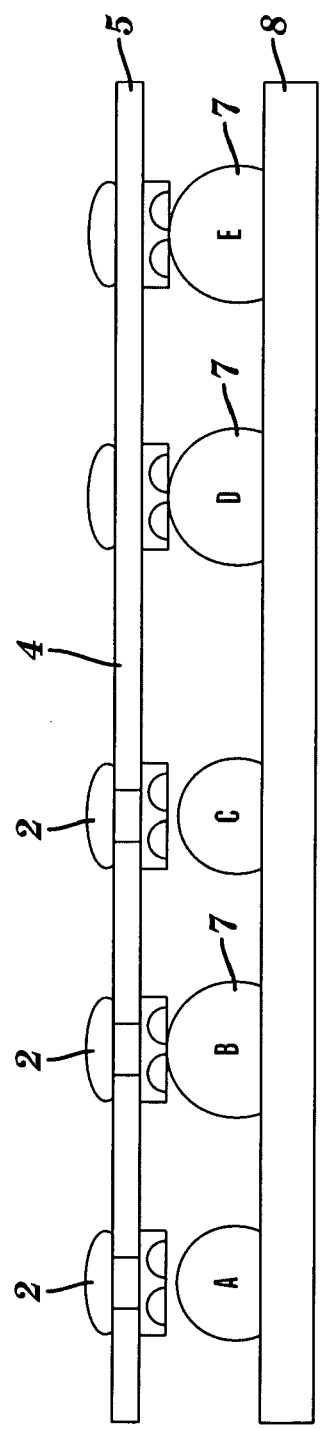
FIG. 1A and FIG. 1B, collectively referred to herein as FIG. 1, depicts a cross section of a prior art rigid microprobe.
Figure 1B:
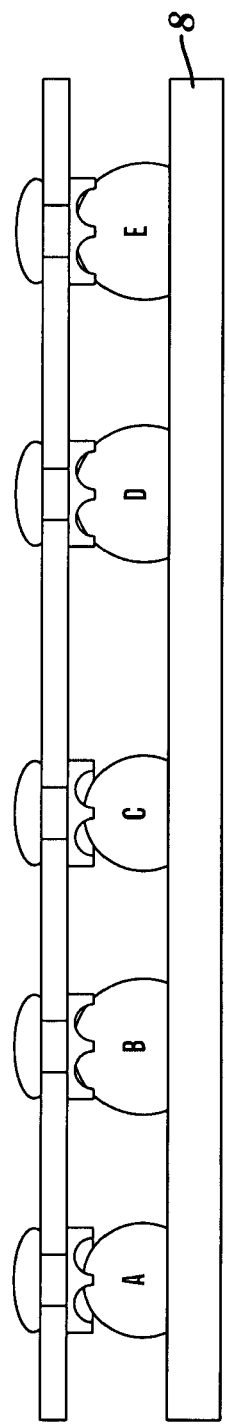

As a review of the prior art, FIG. 1 is provided. FIG. 1A depicts a wafer 8 having a plurality of connection points 7. The connection points 7 include solder balls of varying sizes (and shapes). For example, solder balls A and C are notably smaller than solder balls B, D and E. A prior art rigid sample probe 5 includes a plurality of contacts 2. As the rigid sample probe 2 is depressed upon the wafer 8, the contacts 2 make electrical connection with the connection points 7. As may be noted in FIG. 1B, some of the electrical connections are not as robust as might be desired. That is, in this example, the electrical connections with connection points A and C are not as substantial as the electrical connections with connection points B, D and E.

Figure 2:
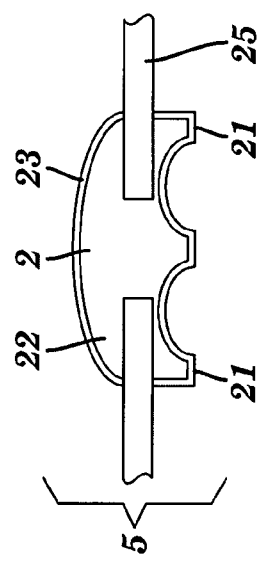
FIG. 2 depicts a cross section of a portion of the rigid membrane probe of FIG. 1.

With regard to FIG. 2, there are shown aspects of an embodiment of the prior art rigid membrane probe 5 shown in FIG. 1. As shown, the rigid membrane probe 5 includes a contact 2 that has a metallic core 22, a protective exterior 23 and a contact area 21. The contact is supported by a membrane 25.

Figure 3:
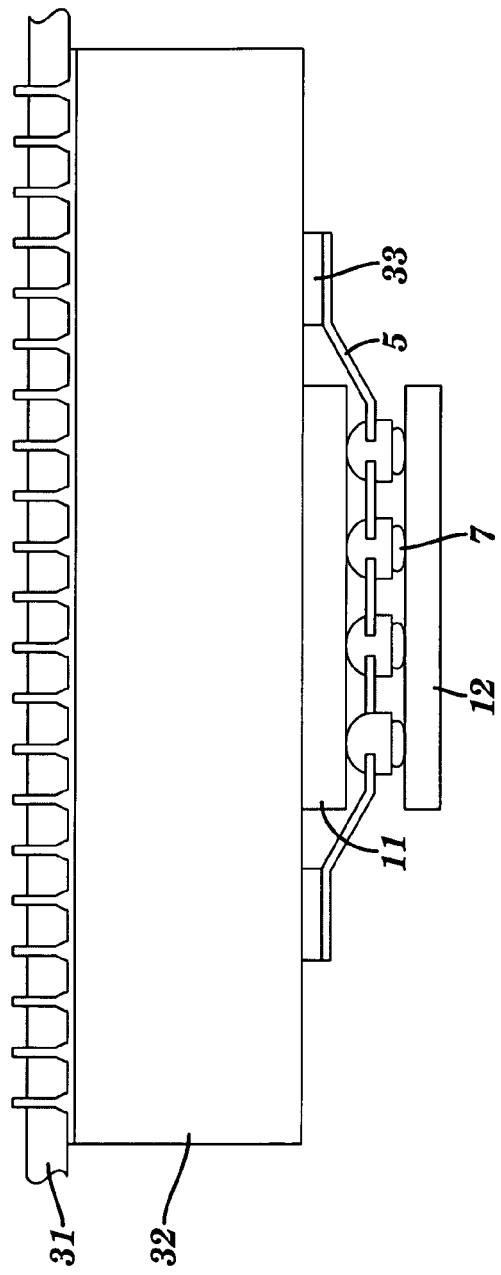
FIG. 3 depicts aspects of apparatus for performing a measurement using the rigid membrane probe of FIGS. 1 and 2.

With regard to FIG. 3, aspects of an embodiment of an apparatus for performing measurements with the prior art rigid membrane probe 5 of FIGS. 1 and 2 are depicted. In this example, the rigid probe 5 is mounted to a transformer 32 by at least one mount 33. The transformer 32 may be mounted upon a printed circuit board 31 for providing further processing capabilities. The rigid probe 5 is generally in contact with a pedestal 11 which communicates with the transformer 32. In general, the pedestal 11 provides an electrical interface for receiving signals from the rigid probe 5. As shown in FIG. 3, the rigid probe 5 may be aligned with connection points 7 (such as solder balls) of an integrated circuit 12 for performing test measurements.

One skilled in the art will recognize that an apparatus such at the one shown in FIG. 3 may be used in conjunction with other types of probes, such as the one disclosed herein. Accordingly, and in general, embodiments of the apparatus may include a compliant membrane probe 20, a device for communication with the compliant membrane probe 20 and an interface for providing signals from the compliant membrane probe 20, such as to a processor.

Figure 4:
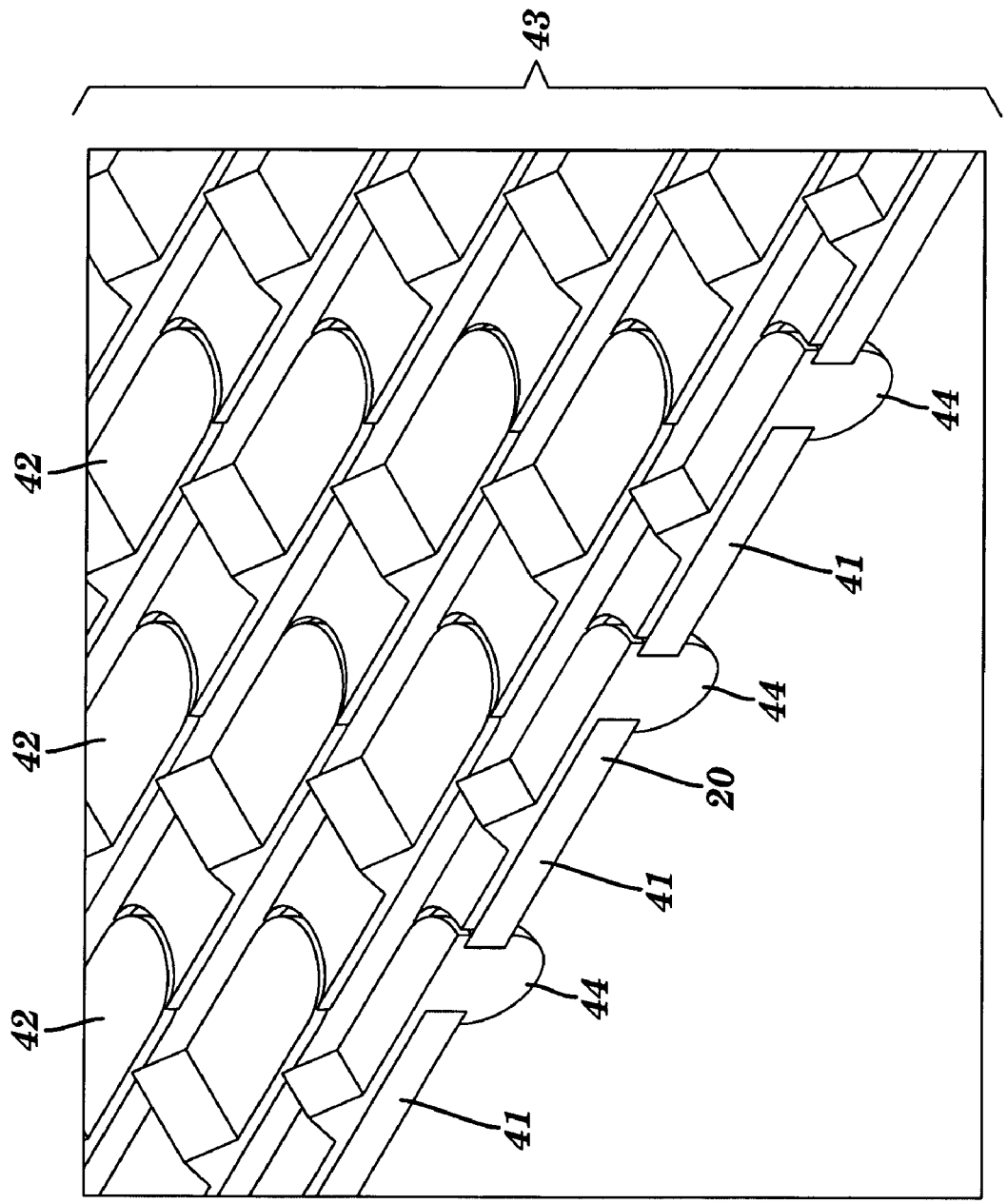
FIG. 4 depicts an array of conductors as a part of the compliant membrane probe.

Now with reference to FIG. 4, there are shown aspects of the compliant membrane probe 20. The probe 20 includes an array 43 of conductors 42. The conductors 42 are mounted in a flexible membrane 41. The flexible membrane 41 may be formed of a variety of materials. In some embodiments, the flexible membrane includes a non-conductive film formed of polyimide. Other similar materials may be used for the flexible membrane 41. The conductors 42 may be formed into the flexible membrane 41 using techniques such as photolithography and other similar or competitive techniques. Each of the conductors 42 includes a probe tip 44 for making contact with measurement apparatus, such as the transformer 32 and the pedestal 11.

The array 43 may be designed for contact with and performing measurements of a high density pin count integrated circuit. More specifically, the compliant membrane probe 20 is not limited to peripheral patterns or wirebond patterns. The array 43 may be designed according to a layout for a selected integrated circuit 12. That is, the array 43 may include conductors 42 placed according to connection points 7 of the integrated circuit 12. Accordingly, fabrication of the compliant membrane probe 20 may include mapping of the flexible membrane 41 prior to installation of the conductors 42.

The flexible membrane 41 provides for measurement of signals through connection points 7 that collectively exhibit deviations in parallelism, co-planarity, and flatness. Such measurements may be performed without excessive bias and other contact related issues during testing.

The conductors 42 provide low-inductance, high current capacity contacts for performing measurements. Advantageously, the conductors 42 may be formed using existing photolithography and plating techniques. Thus, improved scale, cost, production rate and other factors may be realized in comparison to the prior art. Further aspects of the conductor 42 are provided with reference to FIG. 5.

Figure 5:
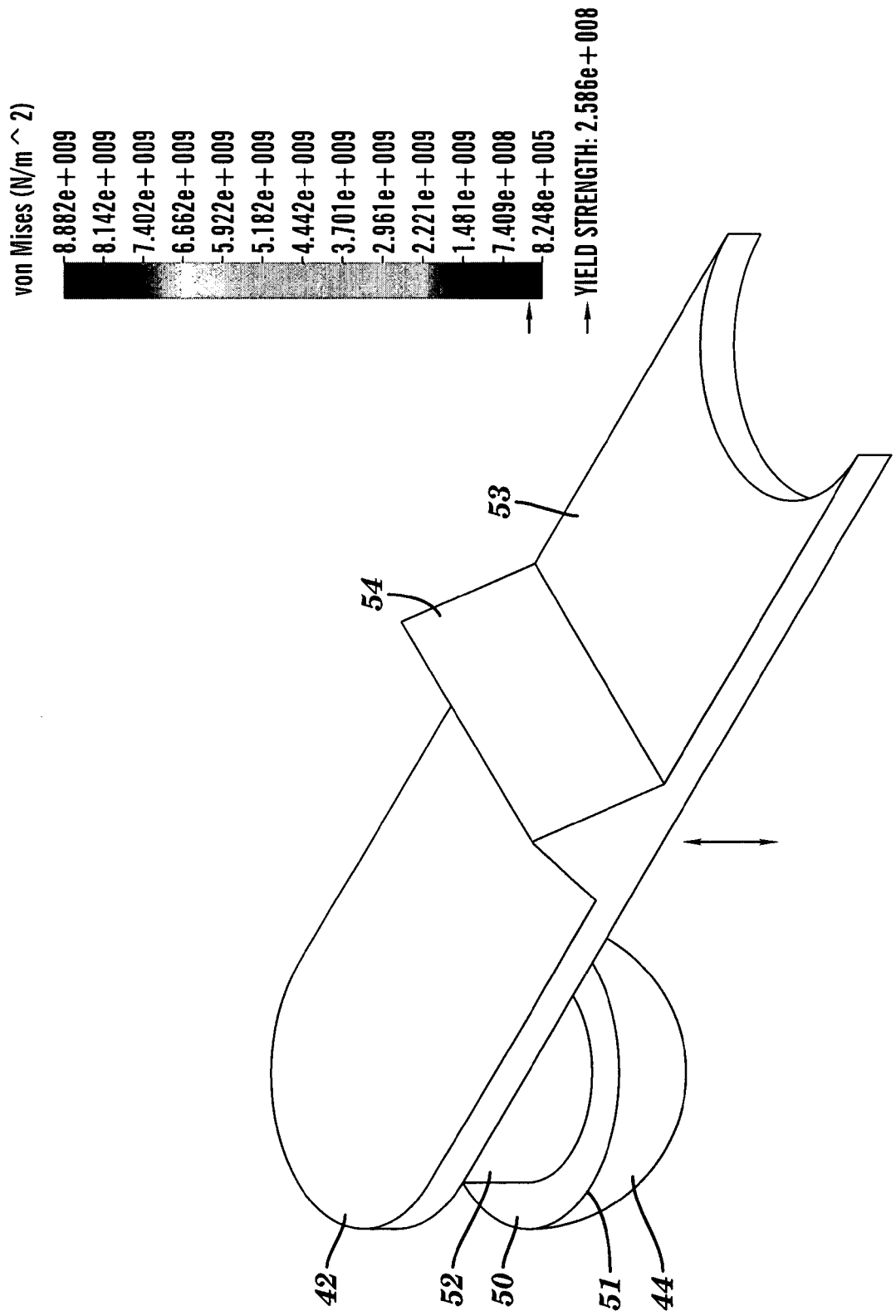
FIG. 5 depicts aspects of one of the conductors.

In FIG. 5, an exemplary embodiment of the conductor 42 is depicted. In this example, the conductor 42 generally includes a rivet 50 that includes a head 51 and a throat 52. The head 51 serves multiple purposes. That is, the head 51 serves as the probe tip 44 as well as mechanical support. More specifically, without regard for edge effects in the compliant membrane probe 20, each beam (i.e., conductive member) is at least partially supported by an adjacent conductor 42.

The conductor 42 includes a beam 53 that includes a contact 54. The contact 54 provides for making contact with the integrated circuit 12. The beam 53 originates above the throat 52 and extends in a direction away from and perpendicular to the throat 52. When installed in the flexible membrane 41, the throat 52 is generally surrounded by the material forming the flexible membrane 41. The head 51 of the rivet 50 is disposed on a side of the flexible membrane 41 that is opposite to the side providing the beam 53 and the contact 54. The head 51 and the beam 53 generally include a diameter that is greater than the diameter of the throat 52, thus the conductor 42 is securely anchored to the flexible membrane 41. This is shown more clearly in the cross section provided in FIG. 4. The beam 53 of the conductor 42 may extend laterally along a surface of the flexible membrane (i.e., parallel to the flexible membrane 41) up to some selected spacing apart from a next conductor 42 of the array 43. The conductor 42 is conductive of measurement signals obtained from contact with connection points 7 of the integrated circuit 12. As shown by the directional arrow in FIG. 5, the beam 53 may flex, cantilever or otherwise provide vertical motion for improved contact with the connection points 7 of the integrated circuit 12.

In some embodiments of the rivet 50, the head 51 and the throat 52 are formed of a single piece of conductive material. Accordingly, the rivet 50 may be placed through a hole in the flexible membrane 41 at the desired location. The beam 53 may be formed to the rivet 50 by addition of conductive material that facilitates bending forces that may be applied to the beam 53, such as by use of techniques known in the art. Mechanical support of the beam 53 may be facilitated by extending the beam beyond the vertical location of the throat 52 with termination just prior to contact with the adjacent conductor 42. Accordingly, the support is distributed between conductors 42 by the flexible membrane 41.

Figure 6B:
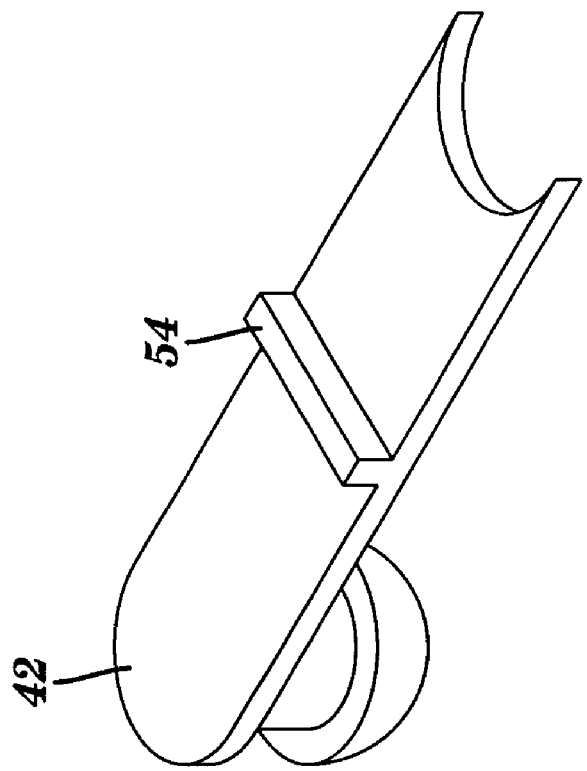
FIG. 6A through FIG. 6F, collectively referred to herein as FIG. 6, depicts various embodiments of conductors.
Figure 6A:
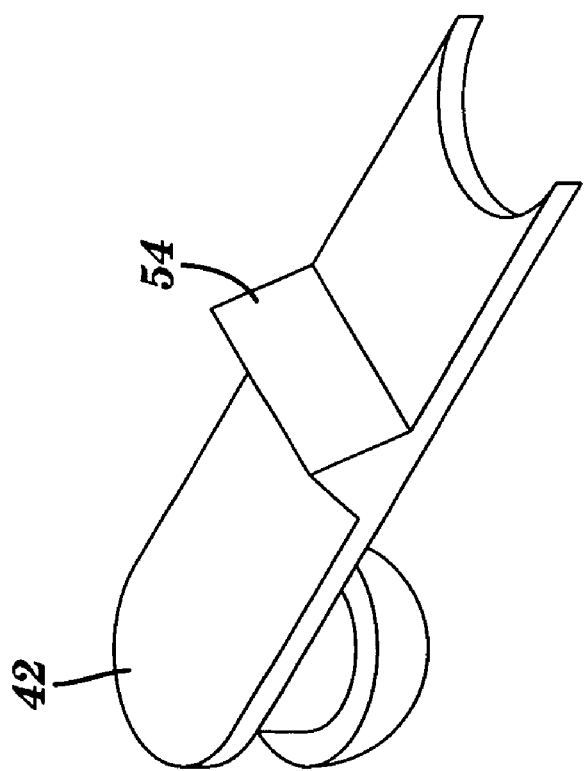
Figure 6D:
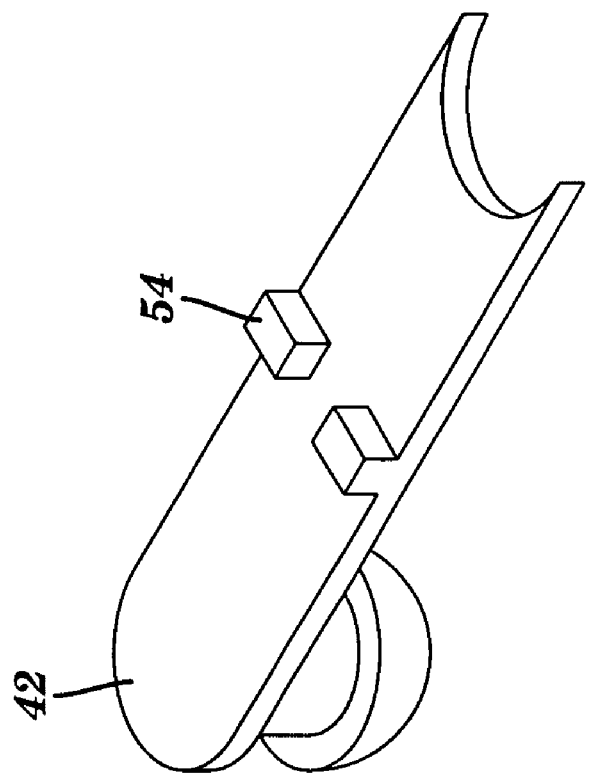
Figure 6C:
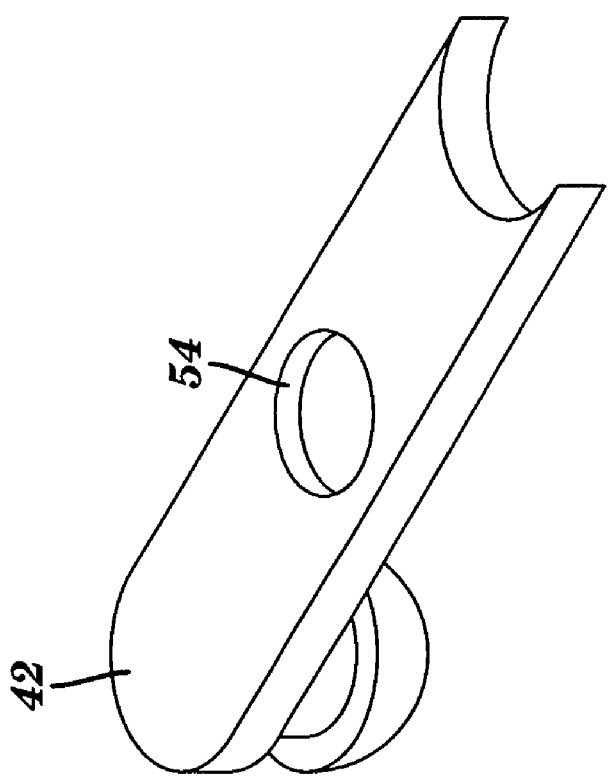
Figure 6F:
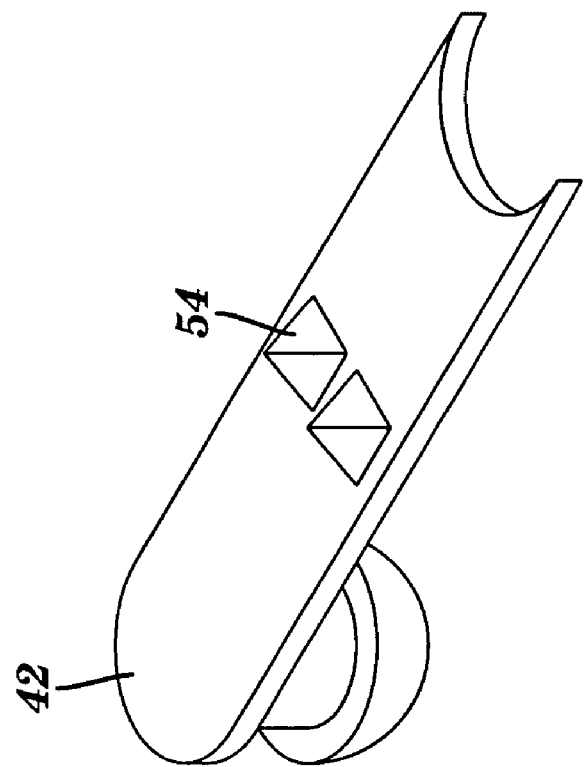
Figure 6E:
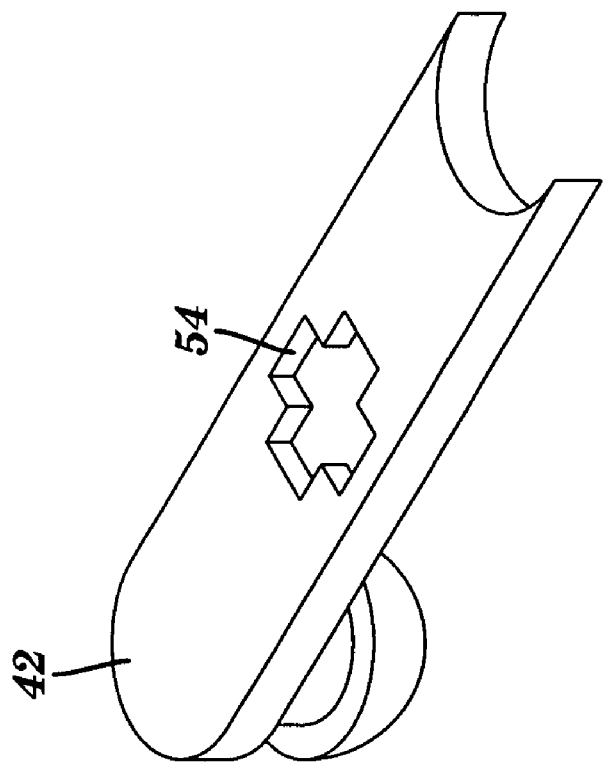

The contact 54 may be adapted for various types or aspects of connection points 7. For example, various tip geometries may be provided. A variety of exemplary embodiments are depicted in FIG. 6. FIG. 6A, depicts a blade geometry for the contact 54; FIG. 6B depicts a flat tipped column geometry; FIG. 6C depicts a circular detent geometry; FIG. 6D depicts a split flat tipped column geometry; FIG. 6E depicts a cross detent geometry; and FIG. 6F depicts a double pyramid geometry. One skilled in the art will recognize that aspects of these geometries may be modified or combined in a variety of ways, and that other geometries may be used. Among other things, one may adjust dimensions including length, width, thickness, height, materials, combinations of materials and other such aspects of the conductor 42 and the contact 54. Accordingly, these geometries are merely exemplary and are not limiting of the contact or the teachings herein.

In general, the compliant membrane probe 20 is vertically offset from a substrate space transformer contact pad. The rivet 51 that contacts the substrate space transformer acts as a pivot and enables the probe 20 to have a vertical component of motion.

Electrical conduction is provided from the substrate space transformer pad to the integrated circuit 12 through the conductor 42 for facilitating test. Any mechanical force required is provided by techniques known in the art. For example, a "wafer prober" that drives a wafer into the array 43 may be used. The probe profile enables a very slight amount of deflection of the probe by offsetting vertically each contact 54 from a contact of the space transformer. The bending (compliant) properties are determined by the supporting film tension and the mechanical properties of the conductive beam 53. A degree of compliance may be altered in a variety of ways. For example, small slits may be cut into the flexible membrane 41, where the slits are parallel to the beam 53, thus permitting additional deflection. In other embodiments, control of a thickness for at least one of the beam 53 and the flexible membrane 41 may be used. Altering compliance may provide for further extending the beam 53 beyond a design specification for a contacting protrusion.

In some further embodiments, a compliant material (such as silicone) is inserted between the film of the compliant membrane probe 20 and the space transformer 32. Clearance holes may be included in the compliant material where the rivets are located.

Accordingly, the compliant membrane probe 20 provides for making contact with high density tight pitch arrays of connection points. Vertical flexibility is achieved by bending the supported horizontal beam 53 with a vertical load in the center.

Figure 7:
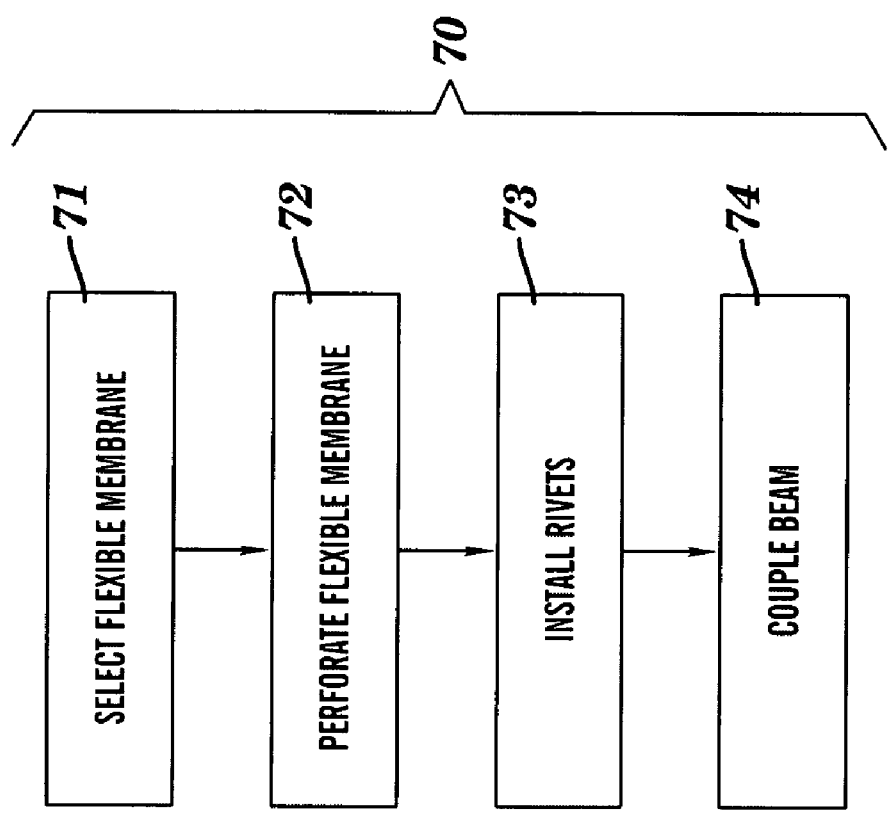
FIG. 7 depicts a method for fabricating the compliant membrane probe.

A method is provided for fabricating the compliant membrane probe 20. Reference may be had to FIG. 7.

In FIG. 7, an exemplary method for fabricating the compliant membrane probe 70 is provided. The method calls for selecting a flexible membrane 71. Once selection has been performed, perforating the flexible membrane 72 is performed. Perforation may include at least one of mechanical perforation, perforation by use of optical techniques (such as by a laser), by molding of material to form the flexible membrane 41, and other techniques. Perforation may be performed according to a design pattern for the integrated circuit 12. Installing rivets 73 calls for placing at least the rivet 50 in the flexible membrane 41. Installation may be performed by at least one of mechanical insertion of the rivet 50 (which may be concurrent to perforation) and forming of the rivet 50 in place (such as by lithography techniques). Coupling of the beam 74 calls for coupling the beam 53 to the throat 52 of the rivet 50. Again, this may be accomplished using known techniques, such as mechanical coupling, lithography and other similarly effective techniques. Further, portions of the method may include using microelectrical mechanical systems (MEMS) technology of at least one of deposition, lithography, and etching.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A probe test head for a high density pin count integrated circuit, the test head comprising:
   a flexible membrane;
   an array of conductors mounted within the flexible membrane, the conductors comprising a beam structure having a first end and a second end, with each of the conductor further comprising a probe tip extending from the first end, the probe tip having a throat generally surrounded by material of the flexible membrane and a head at an end of the throat such that the head is disposed at an opposite side of the flexible membrane with respect to the beam structure; and
   the second end of the beam structure configured so as to be supported by a first end of the beam structure of an adjacent conductor thereto.

2. The test head as in claim 1, further comprising a contact disposed on the beam structure, at an opposite surface of the beam with respect to the probe tip, the contact having at least one of a blade geometry, a flat tipped column geometry, a circular detent geometry, a split flat tipped column geometry, a cross detent geometry and a double pyramid geometry.

3. The test head as in claim 1, wherein the flexible membrane is formed of polyimide, or similar non-conductive materials.

4. The test head as in claim 1, wherein the array comprises a design according to a layout of connection points in the integrated circuit.

5. The test head as in claim 1, wherein the second end of the beam structure is concave shaped so as to be spaced from a convex shaped first end of the beam structure of an adjacent conductor.

6. The test head as in claim 1, wherein the beam structure is configured, to cantilever with respect lo the first end having the probe tip.

7. An apparatus for communicating with an integrated circuit, the apparatus comprising:
   a compliant membrane probe comprising a flexible membrane and an array of conductors mounted with in the flexible membrane, the conductors comprising a beam structure having a first end and a second end, with each conductor further comprising a probe tip extending from the first end, the probe tip having a throat generally surrounded by material of the flexible membrane and a head at an end of the throat such that the head is disposed at an opposite side of the flexible membrane with respect to the beam structure, the second end of the beam structure configured so as to be supported by a first end of the beam structure of an adjacent conductor thereto;
   a device for communication with the compliant membrane probe; and
   an interface for providing signals from the compliant membrane probe.

8. The apparatus of claim 7, wherein the second end of the beam structure is concave shaped so as to be spaced from a convex shaped first end of the beam structure of an adjacent conductor.

9. The apparatus of claim 7, wherein the beam structure is configured to cantilever with respect to the first end having the probe tip.

* * * * *